United States Patent
Sobolewski et al.

(10) Patent No.: US 7,633,308 B1
(45) Date of Patent: Dec. 15, 2009

(54) COMBINED PULSE AND DC TEST SYSTEM

(75) Inventors: Gregory Sobolewski, Seven Hills, OH (US); Pete Hulbert, Cleveland, OH (US); Dave Rubin, Bedford Hts., OH (US)

(73) Assignee: Keithley Instruments, Inc., Cleveland, OH (US)

( * ) Notice: Subject to any disclaimer, the term of this patent is extended or adjusted under 35 U.S.C. 154(b) by 0 days.

(21) Appl. No.: 11/704,479

(22) Filed: Feb. 9, 2007

(51) Int. Cl.
*G01R 31/02* (2006.01)
*G01R 31/26* (2006.01)

(52) U.S. Cl. .................................. 324/765; 324/763
(58) Field of Classification Search ............... None
See application file for complete search history.

(56) References Cited

U.S. PATENT DOCUMENTS

| | | | | |
|---|---|---|---|---|
| 3,911,579 A | * | 10/1975 | Lane et al. | 30/346.54 |
| 5,519,327 A | * | 5/1996 | Consiglio | 324/678 |
| 6,429,674 B1 | * | 8/2002 | Barth et al. | 324/763 |
| 6,838,865 B2 | * | 1/2005 | O'Meara | 323/328 |
| 6,998,869 B2 | * | 2/2006 | Tanida et al. | 324/765 |
| 7,102,357 B2 | * | 9/2006 | Kantorovich et al. | 324/522 |
| 2005/0088197 A1 | * | 4/2005 | Aghaeepour | 324/765 |

OTHER PUBLICATIONS

Efficient Microwave Bias and Testing Using the HP 4142B Modular DC Source/Monitor. Hewlett Packard. Application Note 1205 (Date: At least as early as Aug. 30, 2006.).

* cited by examiner

*Primary Examiner*—Ha Tran T Nguyen
*Assistant Examiner*—Roberto Velez
(74) *Attorney, Agent, or Firm*—Pearne & Gordon LLP

(57) ABSTRACT

A system for making HF and DC measurements on a DUT includes a HF unit having a HF connection terminal that is switchable to a connected or disconnected state; a DC unit having a DC connection terminal that is switchable to a connected or disconnected state; and a common connection between the connection terminals adapted to be connected to the DUT. The DC connection terminal has a transmission line characteristic that is impedance-matched to minimize reflections when the HF connection terminal is in the connected state and the DC connection terminal is in the disconnected state.

15 Claims, 2 Drawing Sheets

COMBINED PULSE AND DC TEST SYSTEM

BACKGROUND OF THE INVENTION

The present invention relates to electrical measurements and, in particular, to the testing of semiconductor devices.

To fully test many devices it is necessary to not only test the direct current (DC) characteristics of the device, but also to test the high frequency (HF) characteristics. The HF frequency characteristics may include radio frequency (RF) characteristics, pulse characteristics or both. Measuring pulse characteristics have similar issues to measuring RF characteristics because fast rise time and fall time pulses (as well as fast pulse repetition rates) have substantial high frequency content.

As the number of devices on a board, chip or wafer increase, it has become more important to be able to quickly, as well as accurately, make measurements. In addition, when many devices are being tested at the same time, cabling to the device under test (DUT) also becomes an issue. It may be difficult to bring all of the desired cable connections close to the DUT, this is particularly true when both HF and DC measurements are desired. It is particularly desirable to avoid re-cabling for each type test because of the time involved and to avoid doubt of correlation of measurement results between HF and DC regimes. For speed and reliability, using the same test pins for both HF and pulse testing is desired, but switching the connections at the DUT greatly increases the complexity of the test head setup.

SUMMARY OF THE INVENTION

A system for making HF and DC measurements on a DUT includes a HF unit having a HF connection terminal that is switchable to a connected or disconnected state; a DC unit having a DC connection terminal that is switchable to a connected or disconnected state; and a common connection between the connection terminals adapted to be connected to the DUT. The DC connection terminal has a transmission line characteristic that is impedance-matched to minimize reflections when the HF connection terminal is in the connected state and the DC connection terminal is in the disconnected state.

DESCRIPTION OF THE PREFERRED EMBODIMENTS

Figure 1:
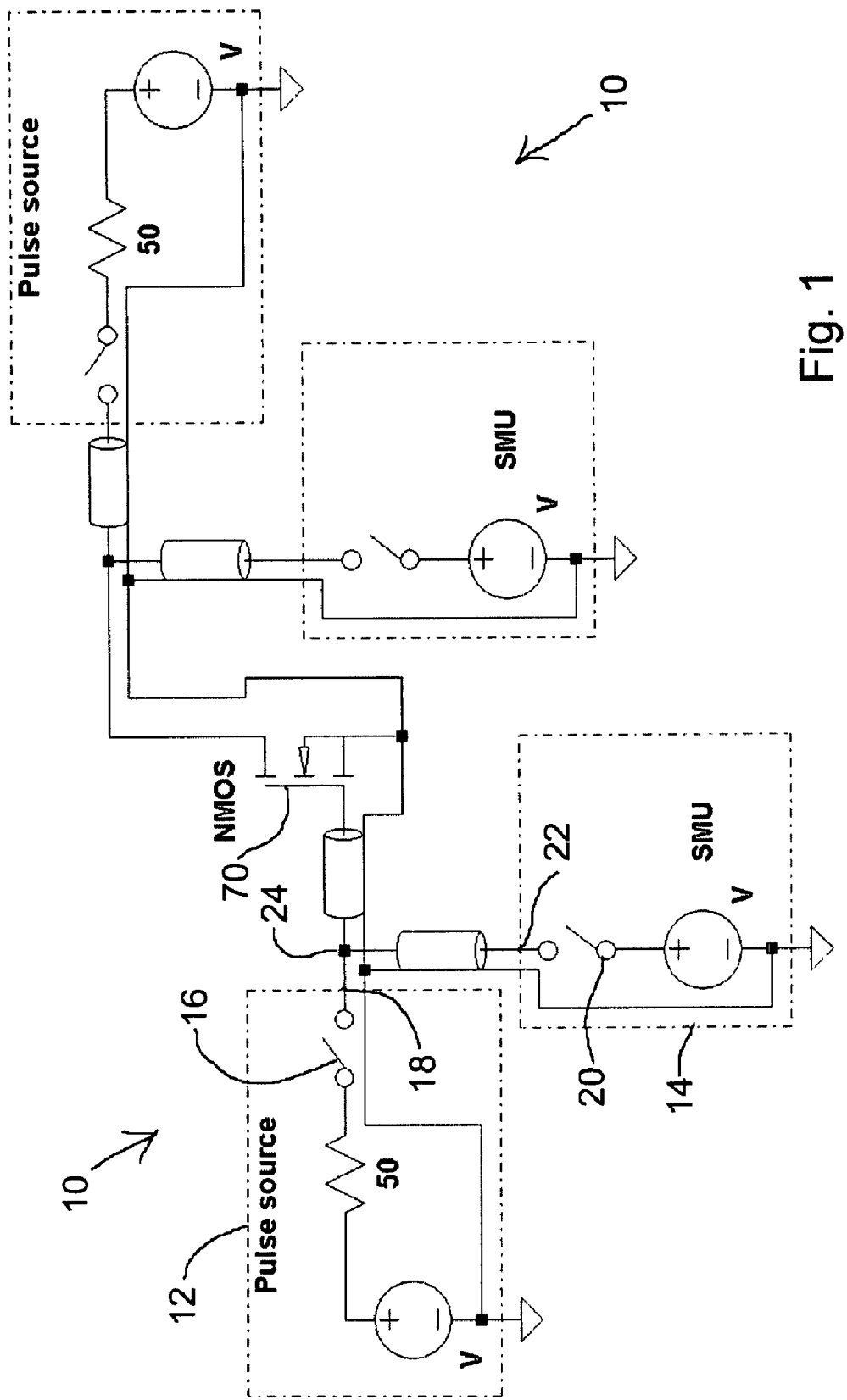
FIG. 1 is a schematic diagram of an example test system according to the invention.

Referring to FIG. 1, two test systems 10 are connected to a DUT 70. A test system 10 includes a HF unit 12 and a DC unit 14. The HF unit 12 has a switch 16 that either connects or disconnects a HF connection terminal 18. The DC unit 14 has a switch 20 that either connects or disconnects a DC connection terminal 22. The DC connection terminal and the HF connection terminal are connected to a common connection 24 that in operation is connected to the DUT 70.

The HF unit 12 may be, for example, a pulse generator or a RF generator. Because of the frequencies involved, the connections/cables should have transmission line characteristics that minimize reflections. A HF measurement device may also be included in the HF unit 12 as described in an embodiment disclosed below.

As is well known, transmission line behavior exhibits impedances that, rather than being discrete, are distributed along a transmission line (e.g., coaxial cable, twin lead, spaced circuit board traces, etc.). Geometry, material and frequency are important to the characteristics, but are well understood. In particular, it is known that minimizing reflections on the transmission line will provide for minimum distortion of signals propagating on the line. This is typically accomplished by matching all of the characteristic impedances of the circuit.

The DC unit 14 may be, for example, a source measure unit. These devices are capable of sourcing a DC voltage and measuring a resulting DC current or vice versa. As DC devices, transmission line considerations are normally foreign to their design and operation. However, in the present invention, the DC connection terminal 22 is also designed to exhibit transmission line characteristics that minimize reflections.

In operation, when DC testing of the DUT 70 is desired, the switch 16 is open and the switch 20 is closed. Because the system 10 is then in DC mode, no transmission line behavior with respect to the HF connection terminal 18 is exhibited, it is as if the HF unit 12 is not there.

When HF testing of the DUT 70 is desired, the switch 16 closed and the switch 20 is open. Because the system 10 is then in HF mode, transmission line behavior is exhibited. In particular, the DC connection terminal 22 (which may be thought of as an impedance stub), if not configured according to the invention, will produce a signal degrading impedance mismatch.

One approach to designing the DC connection terminal is to make it as short as possible, for example, less than one inch in length, preferably between 0.05 and 0.15 inches. Essentially, a sufficiently short stub is like no stub. In general, the permissible stub length is related to the desired frequency transmission. Higher frequencies imply shorter stubs.

Figure 2:
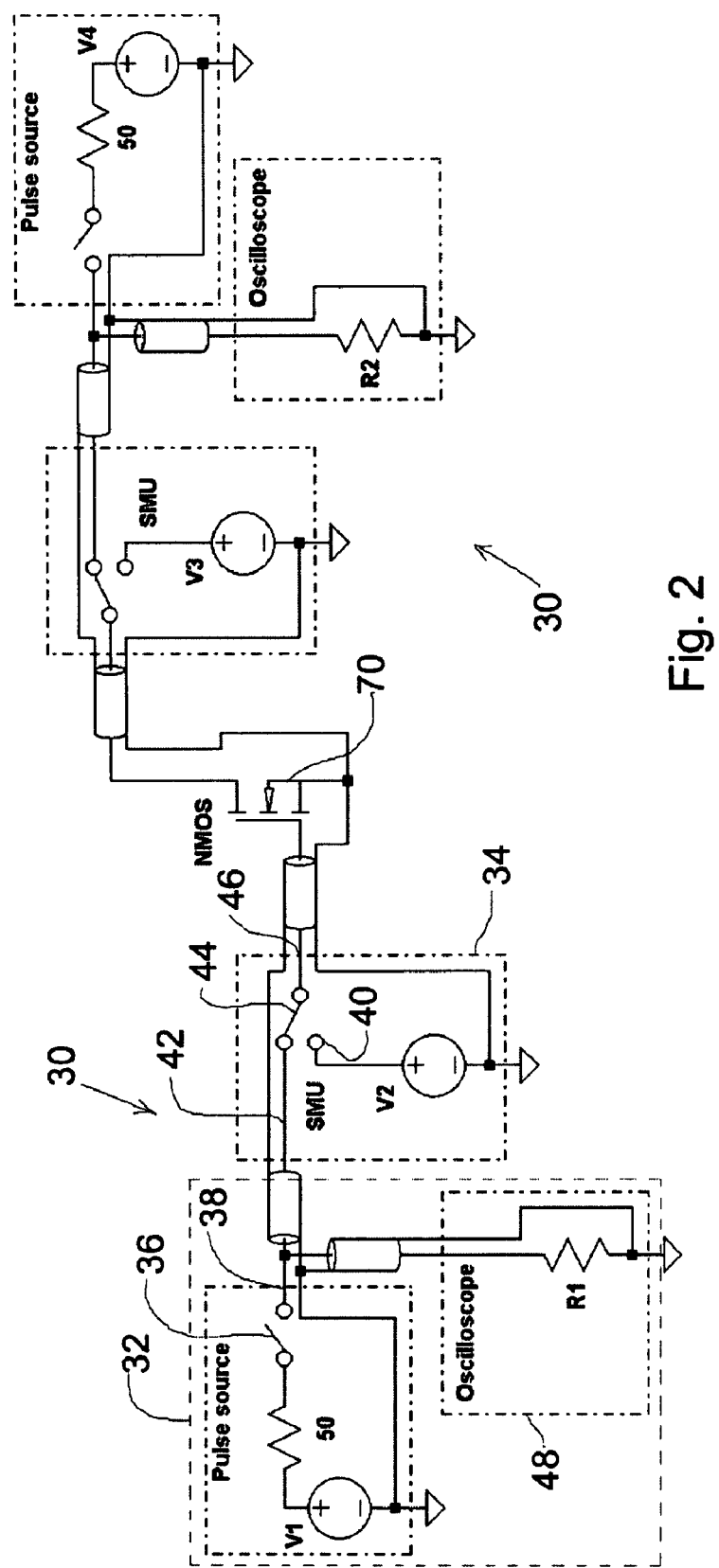
FIG. 2 is a schematic diagram of another example of a test system according to the invention.

Referring to FIG. 2, two test systems 30 are connected to a DUT 70. A test system 30 includes a HF unit 32 and a DC unit 34. The HF unit 32 has a switch 36 that either connects or disconnects a HF connection terminal 38. The DC unit 34 has a DC connection terminal 40, an inline HF connection terminal 42 that is connected to the HF connection terminal 38 and a switch 44 that either connects the DC connection terminal 40 or the inline HF terminal 42 to a DUT connection terminal 46. In operation, the DUT connection terminal 46 is connected to the DUT 70.

The combination of the inline HF connection terminal 42 and the DUT connection terminal 46 has a transmission line characteristic that is impedance-matched to minimize reflections. It can be noted that in this embodiment, there is no DC connection terminal stub because of the use of the form "C" switch 44.

The HF unit 32 also includes a HF measurement device 48, connected to the HF connection terminal 38. The HF measurement device 48 may be, for example, an oscilloscope.

In operation, when DC testing of the DUT 70 is desired, the switch 36 is open and the switch 44 is in the DC connection terminal 40 position. Because the system 30 is then in DC mode, no transmission line behavior with respect to the HF connection terminal 18 is exhibited, it is as if the HF unit 32 is not there.

When HF testing of the DUT 70 is desired, the switch 36 closed and the switch 44 is in the inline HF connection terminal 42 position. Because the system 30 is then in HF mode, transmission line behavior is exhibited. In particular, the combination of the inline HF connection terminal 42 and the DUT connection terminal 46 need to act as a matched transmission line through the DC unit 34. If not configured according to the invention, the combination will produce a signal degrading impedance mismatch.

The present invention allows a single set of cables to be run to the DUT for both DC and HF tests to be performed on the same test pins. This eliminates re-cabling by using the same cables for both regimes.

The invention also simplifies the connection of test instruments as complex matrix switches or techniques such as using bias tees to combine HF and DC measurements are not required.

The use of a inline HF connector terminal in particular simplifies instrument connection as it permits just daisy-chaining the HF unit with the DC unit followed by one set of cables to the DUT.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A system for making high frequency and direct current measurements on a DUT, said system comprising: a high frequency unit having a high frequency connection terminal that is switchable to a connected or disconnected state; a direct current unit having a direct current connection terminal that is switchable to a connected or disconnected state; and a common connection between said connection terminals configured to be connected to said DUT, wherein said direct current connection terminal has a transmission line characteristic that is impedance-matched to minimize reflections when said high frequency connection terminal is in said connected state and said direct current connection terminal is in said disconnected state.

2. A system according to claim 1, wherein the length of said direct current connection terminal is minimized.

3. A system according to claim 2, wherein said length is less than one inch.

4. A system according to claim 2, wherein said length is between 0.05 and 0.15 inches.

5. A system according to claim 1, wherein said high frequency unit includes a pulse generator.

6. A system according to claim 1, wherein said high frequency unit includes a radio frequency generator.

7. A system according to claim 1, wherein said direct current unit is a source measure unit.

8. A system according to claim 1, wherein said high frequency unit includes an high frequency measurement device.

9. A system according to claim 8, wherein said high frequency measurement device comprises an oscilloscope.

10. A system for making high frequency and direct current measurements on a DUT, said system comprising: a high frequency unit having a high frequency connection terminal that is switchable to a connected or disconnected state; and a direct current unit including a direct current connection terminal, an inline high frequency connection terminal connected to said high frequency connection terminal and a DUT terminal that is switchable between said direct current connection terminal and said inline high frequency connection terminal, said direct current unit being daisy-chained with said high frequency unit, wherein said DUT terminal is configured to be connected to said DUT and the combination of said inline high frequency connection terminal and said DUT connection terminal has a transmission line characteristic that is impedance-matched to minimize reflections when said high frequency connection terminal is in said connected state and said DUT terminal is switched to connect to said inline high frequency connection terminal.

11. A system according to claim 10, wherein said high frequency unit includes a pulse generator.

12. A system according to claim 10, wherein said high frequency unit includes a radio frequency generator.

13. A system according to claim 10, wherein said direct current unit is a source measure unit.

14. A system according to claim 10, wherein said high frequency unit includes an high frequency measurement device.

15. A system according to claim 14, wherein said high frequency measurement device comprises an oscilloscope.

* * * * *